(12) United States Patent
Bae

(10) Patent No.: US 7,227,372 B2
(45) Date of Patent: Jun. 5, 2007

(54) VOLTAGE MONITORING APPARATUS IN A SEMICONDUCTOR PROBE STATION

(75) Inventor: Jun-Su Bae, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 21 days.

(21) Appl. No.: 10/933,200

(22) Filed: Sep. 2, 2004

(65) Prior Publication Data

US 2005/0099203 A1  May 12, 2005

(30) Foreign Application Priority Data

Sep. 2, 2003  (KR) ............... 10-2003-0061090

(51) Int. Cl.
*G01R 31/26* (2006.01)
(52) U.S. Cl. .................. 324/765; 324/114
(58) Field of Classification Search ............... None
See application file for complete search history.

(56) References Cited

U.S. PATENT DOCUMENTS

| | | | | |
|---|---|---|---|---|
| 4,520,310 A | * | 5/1985 | Kelly et al. ............. | 324/115 |
| 4,574,278 A | * | 3/1986 | Apelman ................ | 345/440.1 |
| 4,581,705 A | * | 4/1986 | Gilker et al. ............ | 702/60 |
| 4,609,914 A | * | 9/1986 | Fathi .................... | 340/660 |
| 5,262,721 A | * | 11/1993 | Ogata ................... | 324/73.1 |
| 5,995,400 A | * | 11/1999 | Park et al. .............. | 363/146 |
| 6,097,616 A | * | 8/2000 | Iwasaki ................. | 363/97 |
| 6,147,483 A | * | 11/2000 | Havel ................... | 324/115 |
| 6,166,649 A | * | 12/2000 | Inoue ................... | 340/660 |
| 6,198,403 B1 | * | 3/2001 | Dorrough et al. ........ | 340/635 |
| 6,246,332 B1 | * | 6/2001 | Hubbard ............... | 340/658 |
| 6,476,729 B1 | * | 11/2002 | Liu ..................... | 340/870.11 |
| 6,535,011 B1 | * | 3/2003 | Sakaguchi ............. | 324/763 |
| 6,690,366 B1 | * | 2/2004 | Kitahashi .............. | 345/211 |
| 2006/0033451 A1 | * | 2/2006 | Chang et al. ........... | 315/247 |

FOREIGN PATENT DOCUMENTS

| | | |
|---|---|---|
| JP | 05-011031 | 1/1993 |
| KR | 1993-0010725 | 11/1993 |
| KR | 1998-067122 | 10/1998 |
| KR | 2003-0049663 | 6/2003 |

OTHER PUBLICATIONS

Patent Abstracts of Japan Publication No. 05-011031.
Korean Intellectual Property Office Korean Patent Abstracts Publication No. 10-1993-0010725.

* cited by examiner

*Primary Examiner*—Ha Tran Nguyen
*Assistant Examiner*—Richard Isla-Rodas
(74) *Attorney, Agent, or Firm*—F. Chau & Associates, LLC

(57) ABSTRACT

An Electrical Die Sorting (EDS) process system for testing semiconductor chips comprises a probe station, a power supply unit configured in the probe station, and a voltage apparatus for measuring voltages of the power supply. The voltage apparatus comprises a measuring unit connected with voltage check terminals and a common ground terminal of the power supply unit, for measuring voltages between each of the voltage check terminals and the common ground terminal simultaneously; and a plurality of display units electrically connected with the measuring unit, for monitoring voltages of the respective voltage check terminals in real time.

14 Claims, 3 Drawing Sheets

VOLTAGE MONITORING APPARATUS IN A SEMICONDUCTOR PROBE STATION

BACKGROUND

1. Technical Field

The present disclosure relates to an apparatus for testing semiconductor integrated circuit chips, and more particularly, to a voltage apparatus for monitoring voltages of a power supply unit in a semiconductor probe station.

2. Discussion of Related Art

Generally, semiconductor products are manufactured through a series of semiconductor manufacturing process. The series of semiconductor manufacturing process include producing a pure silicon wafer, forming a plurality of semiconductor chips on the pure silicon wafer, performing an electrical die sorting (EDS) process, packaging the semiconductor chips, and performing a final test of the packaged semiconductor chips. In the EDS process, each integrated circuit (die) on the wafer is tested to see if the die functions, and inoperative dies are identified and discarded. Therefore, the EDS process is known to reduce an assembly cost and improve die yield.

An EDS process system is disclosed in U.S. Pat. Nos. 6,118,290, 6,353,221 and 6,170,116. The EDS process system includes a probe station, a chuck, a probe card, a performance board, and a tester system. The tester system includes a tester head and a tester body. A wafer is placed on the chuck configured on the probe station. The probe card, the performance board, and the tester head are configured on an upper portion of the chuck. An integrated circuit (IC) chip test program operates on the tester head. The tester body is electrically connected with the tester head. The probe card includes probe needles contacting each chip formed on the wafer and is used to check electrical conditions of the chips.

FIG. 1 is a schematic view of a conventional EDS process system for testing semiconductor chips.

Referring to FIG. 1, the EDS process system includes a probe station 101, a probe card 103, a performance board 105, a tester head 107, and a tester body 109. The probe station 101 includes a power supply unit (not shown) in which twelve voltage check terminals are configured. The power supply unit further includes a separated common ground terminal (not shown) and a receptacle (not shown) capable of supplying a voltage to an exterior.

The twelve voltage check terminals generally include set voltages such as a logic voltage (+/−5V) for the power supply unit and a voltage (+/−15V) for an M/H unit (not shown) conveying the wafer. A motor hold voltage (+8V) is another set voltage used to hold a motor when a driving motor stops. A motor driving voltage (+/−12V), a solenoid driving voltage (+24V), a permanent magnet voltage (+/−28V), an inker voltage are also used as set voltages. A sign, for example, "+/−" means that an allowable error range is an upper and lower 10% of the set voltage. A sign, for example, "+" means that an allowable error range is an upper 10% of the set voltage.

Conventionally, a general digital voltage apparatus is used to measure voltages between each voltage check terminal and the common ground terminal. A measured voltage is respectively compared with a set voltage. If the measured voltage is out of the allowable error range, the measured voltage is adjusted to be identical to the set voltage. Then, a voltage of another voltage check terminal is measured.

SUMMARY OF THE INVENTION

Exemplary embodiments of the invention generally include an Electrical Die Sorting (EDS) process system for testing semiconductor chips. In one exemplary embodiment, the EDS process system comprises a probe station, a power supply unit configured in the probe station, and a voltage apparatus for measuring voltages of the power supply. The voltage apparatus includes a measuring unit connected with voltage check terminals and a common ground terminal of the power supply unit, for measuring voltages between each of the voltage check terminals and the common ground terminal simultaneously, and a plurality of display units electrically connected with the measuring unit, for monitoring respective voltages of the voltage check terminals in real time.

Pins of the measuring unit are connected with the voltage check terminals and the common ground terminal of the power supply unit. The measuring unit comprises a body, a plurality of convex voltage check pins configured on the body to be connected with the voltage check terminals of the power supply unit, and a convex common ground pin configured on the body to be connected with the common ground terminal. The plurality of display units display measured voltages of the respective voltage check terminals and display respective set voltages of the voltage check terminals. The plurality of display units indicate an allowable error with a "+", "−" or "+/−" symbol in front of the respective set voltages. The voltage apparatus further comprises a warning unit signaling when a measured voltage on the display unit is out of an allowable error range. The voltage apparatus further comprises a determining unit for comparing stored set voltages with the measured voltages. The voltage apparatus further comprises a determining unit for comparing stored set voltages with the measured voltages.

In another exemplary embodiment of the invention, a voltage apparatus for monitoring voltages of a power supply unit in a probe comprises a measuring unit connected with voltage check terminals and a ground terminal of a power supply unit, for measuring voltages between each of the voltage check terminals and the common ground terminal simultaneously, a voltage apparatus body electrically connected with the measuring head, and a plurality of display units configured on the voltage apparatus body for displaying measured voltages and set voltages.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION OF THE INVENTION

Exemplary embodiments of the present invention will now be described more fully hereinafter below with reference to the accompanying drawings. This invention may, however, be embodied in different forms and should not be construed as limited to the exemplary embodiments set forth herein. Rather, these exemplary embodiments are provided so that this disclosure will be thorough and complete, and will fully convey the scope of the invention to those skilled in the art.

Figure 1:
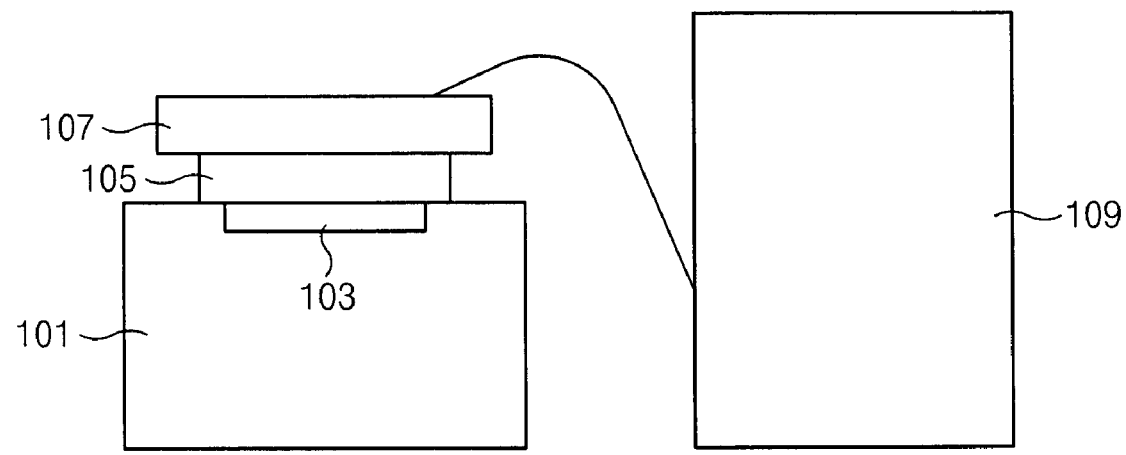
FIG. 1 is a schematic view of a conventional EDS process unit for testing semiconductor chips.
Figure 2:
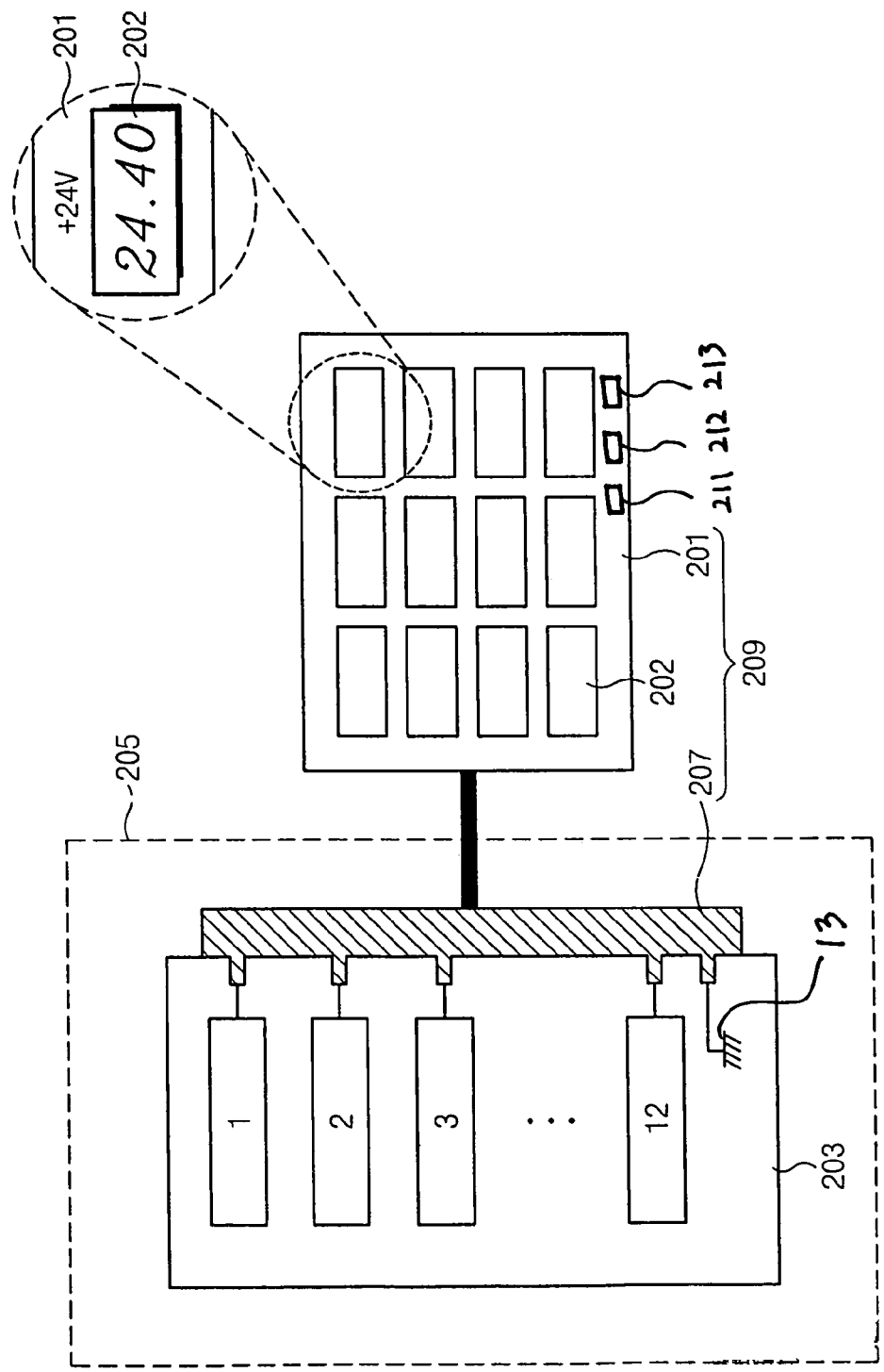
FIG. 2 shows a voltage apparatus for monitoring voltages of a power supply unit in a semiconductor probe station according to an exemplary embodiment of the present invention.

FIG. 2 shows a voltage apparatus for monitoring voltages of a power supply unit in a semiconductor probe station according to an exemplary embodiment of the present invention. Referring to FIG. 2, an EDS process system includes a probe station 205, a power supply unit 203, voltage check terminals 1 to 12, a common ground terminal 13, and a voltage apparatus 209. The voltage apparatus 209 includes a measuring unit 207, a voltage apparatus body 201 and a plurality of the display units 202. The measuring unit 207 can be simultaneously connected with all of twelve voltage check terminals 1 to 12 and the common ground terminal 13.

The twelve voltage check terminals 1 to 12 and the common ground terminal 13 are configured in the power supply unit 203. The measuring unit 207 measures voltages between each voltage check terminal 1 to 12 and the common ground terminal 13. A plurality of the display units 202 display measured voltages. For instance, a voltage measured between a first voltage check terminal 1 and the common ground terminal 13 is displayed on a first display unit. A voltage measured between a second voltage check terminal 2 and the common ground terminal 13 is displayed on a second display unit. In this manner, all of the twelve measured voltages are displayed on the plurality of the display units 202. A measured voltage is displayed on one of the display unit 202 and a set voltage is marked above the display unit 202.

To indicate an allowable error, a "+", "−", or "+/−" symbol can be used in front of the set voltage. For instance, if the allowable error range is upper or lower 10% of the set voltage, a symbol "+" or "−" is used in front of the set voltage. The symbol "+" means that the allowable error range is an upper 10% of the set voltage. The symbol "−" means that the allowable error range is a lower 10% of the set voltage. The symbol "+/−" means that a range of the allowable error range is an upper and lower 10% of the set voltage.

If the set voltages change according to options of the voltage apparatus, it is preferable to indicate all the set voltages according to the options. For instance, if the set voltage is 5V or 12V according to the options, it can be displayed as 5/12V.

The conventional art measures the voltages of the twelve voltage check terminals with respect to the common ground terminal one-by-one. In other words, for example, a voltage between a second voltage check terminal and the common ground is measured after a voltage between a first voltage check terminal and the common ground is measured. The voltage apparatus 209 according an exemplary embodiment of the present invention measures the twelve voltages at a time and shows the twelve measured voltages continuously on the plurality of the display units 202.

The voltage apparatus 209 may further include a warning unit (211) configured in the voltage apparatus body 201. The warning unit 211 signals when the measured voltage is out of an allowable error range of the set voltage. The warning unit 211 may be a lamp, emitting different colors of light according to a normal state or an abnormal state. The normal state means the measured voltage is in the allowable error range, and the abnormal state means the measured voltage is out of the allowable error range. The warning unit 211 may be an alarm, generating a specific sound in case of an abnormal state, and/or generating a backlight of the display unit changing according to the normal state or abnormal state.

Preferably, the voltage apparatus 209 can further include a memory unit (212) for storing set values and error ranges of the respective terminals. The voltage apparatus 209 can further include a determining unit (213) for comparing the stored set values with the measured values, and for generating a signal if the measured voltage is out of the allowable error range.

The voltage measuring method according to the conventional art includes recognizing the measured voltage, recognizing the set voltage, comparing the measured voltage with the set voltage, and adjusting an abnormal voltage. The voltage measuring method according to an exemplary embodiment of the present invention includes recognizing the measured voltage and the set voltage simultaneously, comparing the measured voltage with the set voltage, and adjusting an abnormal voltage.

Figure 3:
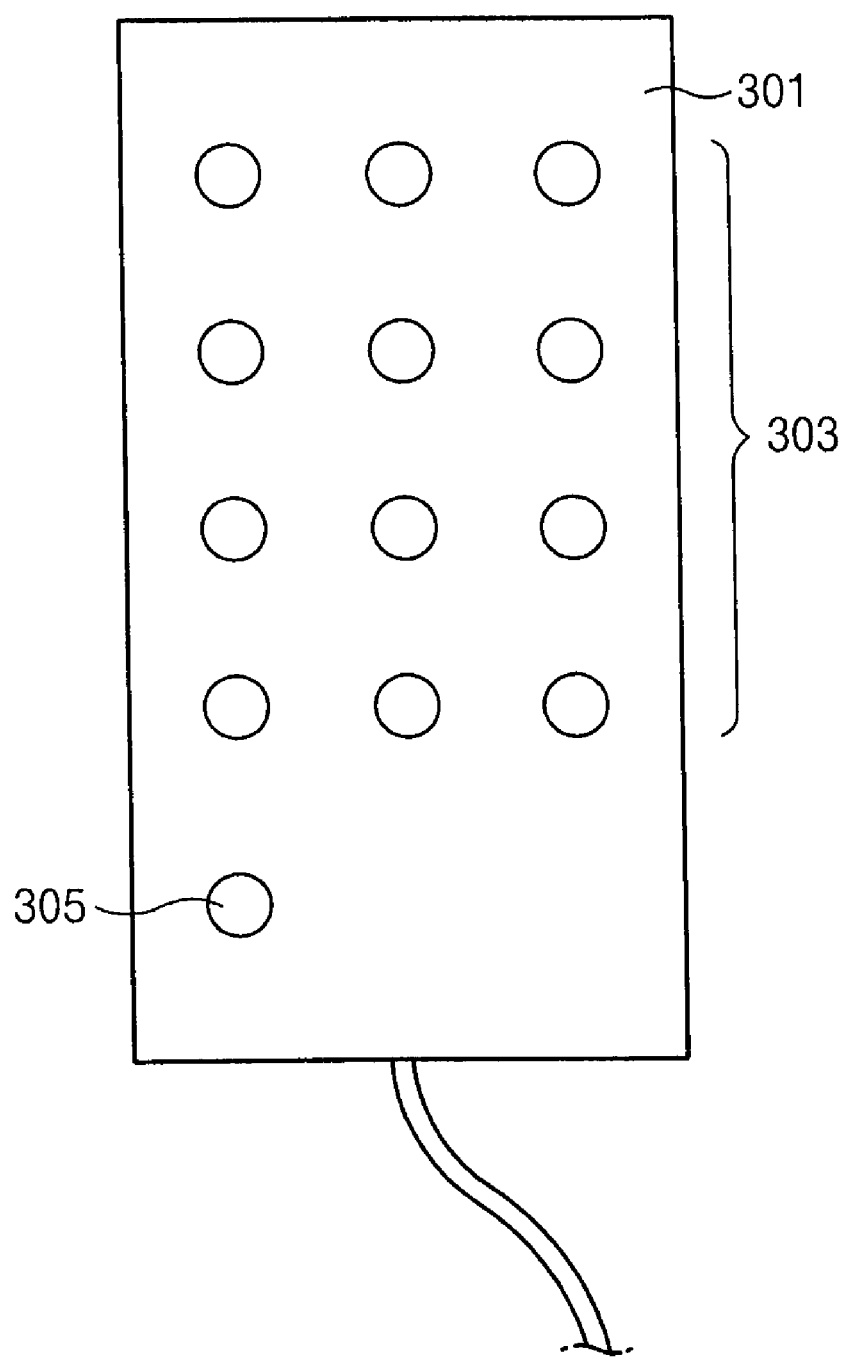
FIG. 3 shows a measuring unit of the voltage apparatus.

FIG. 3 shows the measuring unit of the voltage apparatus according to an exemplary embodiment of the present invention.

Referring to FIG. 3, the measuring unit 301 includes voltage check pins 303 and a common ground pin 305. Preferably, the voltage check pins 303 and the common ground pin 305 are shaped convex. Preferably, locations of the voltage check pins 303 and the common ground pin 305 can be changed according to locations of the voltage check terminals and the common ground terminal of the power supply unit 203.

Generally, the measuring unit 300 includes voltage check pins 303, the common ground pin 305, and a body 301. The voltage check pins 303 and the common ground pin 305 are to be connected with the voltage check terminals (1 to 12 in FIG. 2) and the common ground terminal (13 in FIG. 2), respectively. The voltage check pins 303 and the common ground pin 305 are configured in the body 301. The measuring unit 300 further includes a wire 304 electrically connecting the voltage apparatus 209 and the measuring unit 207 in FIG. 2. The wire 304 is electrically connected with the voltage check pins 303 and the common ground pin 305 in the measuring unit 300.

The voltage apparatus according to an exemplary embodiment of the present invention is configured in the probe station and monitors the voltages in real time. Accordingly, the EDS process system according to an exemplary embodiment of the present invention saves time and manpower in measuring and adjusting voltages.

Although the exemplary embodiments have been described herein with reference to the accompanying drawings, it is to be understood that the present invention is not limited to those precise embodiments, and that various other changes and modifications may be affected therein by one of ordinary skills in the related art without departing from the scope or spirit of the invention. All such changes and modifications are intended to be included within the scope of the invention as defined by the appended claims.

What is claimed is:

1. An Electrical Die Sorting (EDS) process system for testing semiconductor chips, the EDS process system comprising:
   a probe station;
   a power supply unit configured in the probe station for supplying power to the probe station, the power supply unit comprising voltage check terminals and a common ground terminal; and
   a voltage apparatus for measuring voltages of the power supply unit, the voltage apparatus comprising:
      a measuring unit for measuring voltages between each of the voltage check terminals and the common ground terminal simultaneously having:
         a body;
         a plurality of voltage check pins disposed on the body for receiving corresponding voltage check terminals of the power supply unit; and
         a common ground pin disposed on the body for receiving the common ground terminal of the power supply unit; and
      a plurality of display units electrically connected with the measuring unit, for displaying voltages of the respective voltage check terminals in real time.

2. The EDS process system of claim 1, wherein each of the plurality of voltage check pins and the common ground pin are convex shape.

3. The EDS process system of claim 1, wherein the plurality of display units continuously display measured voltages of the respective voltage check terminals and display set voltages of the respective voltage check terminals.

4. The EDS process system of claim 1, wherein the voltage apparatus further comprises a warning unit signaling when a measured voltage on a display unit is out of an allowable error range of a set voltage.

5. The EDS process system of claim 1, wherein the voltage apparatus further comprises a memory unit for storing set voltage and error ranges of the respective voltage check terminals.

6. The EDS process system of claim 5, wherein the voltage apparatus further comprises a determining unit for comparing stored set voltages with measured voltages.

7. The EDS process system of claim 6, wherein the plurality of display units indicate an allowable error range with a "+", "−" or "+/−" symbol in front of the set voltages.

8. A voltage apparatus for monitoring voltages of a power supply unit in a semiconductor probe station, the voltage apparatus comprising:
   a measuring unit for measuring voltages between each of voltage check terminals and a common ground terminal of the semiconductor probe station power supply unit simultaneously, the measuring unit comprising:
      a body;
      a plurality of voltage check pins disposed on the body for receiving corresponding voltages check terminals of the power supply unit; and
      a common ground pin disposed on the body for receiving the common ground terminal of the power supply unit; and
   a plurality of display units electrically connected to the measuring unit for displaying voltages of the respective voltage check terminals in real time.

9. The voltage apparatus of claim 8, wherein each of the plurality of voltage check pins and the common ground pin are convex shaped.

10. The voltage apparatus of claim 8, wherein the plurality of display units continuously display measured voltages of the respective voltage check terminals and display set voltages of the respective voltage check terminals.

11. The voltage apparatus of claim 8, wherein the voltage apparatus further comprises a warning unit signaling when a measured voltage on a display unit is out of an allowable error range of a set voltage.

12. The voltage apparatus of claim 8, wherein the voltage apparatus further comprises a memory unit for storing set voltages and error ranges of the respective voltage check terminals.

13. The voltage apparatus of claim 12, wherein the voltage apparatus further comprises a determining unit for comparing stored voltages with measured voltages.

14. The voltage apparatus of claim 13, wherein the plurality of display units indicate an allowable error range with a "+", "−" or "+/−" symbol in front of the set voltages.

* * * * *